US010665459B2

(12) United States Patent
Nakata

(10) Patent No.: US 10,665,459 B2
(45) Date of Patent: May 26, 2020

(54) METHOD FOR MANUFACTURING SEMICONDUCTOR DEVICE

(71) Applicant: Mitsubishi Electric Corporation, Chiyoda-ku, Tokyo (JP)

(72) Inventor: Kazunari Nakata, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 0 days.

(21) Appl. No.: 16/324,220

(22) PCT Filed: Sep. 28, 2017

(86) PCT No.: PCT/JP2017/035218
§ 371 (c)(1),
(2) Date: Feb. 8, 2019

(87) PCT Pub. No.: WO2018/070263
PCT Pub. Date: Apr. 19, 2018

(65) Prior Publication Data
US 2020/0090937 A1 Mar. 19, 2020

(30) Foreign Application Priority Data
Oct. 13, 2016 (JP) ................. 2016-201423

(51) Int. Cl.
H01L 21/04 (2006.01)
H01L 21/288 (2006.01)
(Continued)

(52) U.S. Cl.
CPC ...... H01L 21/0485 (2013.01); H01L 21/2885 (2013.01); H01L 21/304 (2013.01); H01L 29/1608 (2013.01); H01L 29/78 (2013.01)

(58) Field of Classification Search
None
See application file for complete search history.

(56) References Cited

U.S. PATENT DOCUMENTS 10,522,355 B2 * 12/2019 Yoshimura ............ H01L 21/265
2011/0272711 A1 11/2011 Okano
(Continued)

FOREIGN PATENT DOCUMENTS

JP 09008062 A 1/1997
JP 2006041248 A 2/2006
(Continued)

OTHER PUBLICATIONS

International Search Report (PCT/ISA/210) dated Nov. 28, 2017, by the Japan Patent Office as the International Searching Authority for International Application No. PCT/JP2017/035218.
(Continued)

Primary Examiner — Bradley Smith
(74) Attorney, Agent, or Firm — Buchanan Ingersoll & Rooney PC

(57) ABSTRACT

Included herein are, a step of forming an active region for a semiconductor device on a front surface of a SiC substrate, a step of forming a SiC substrate-to-drain electrode bonding region on a back surface of the SiC substrate by grinding it using an abrasive whose average abrasive grain size is within a specified range, a step of depositing a film of a first drain electrode on the SiC substrate-to-drain electrode bonding region, a step of electrically connecting the first drain electrode with the SiC substrate-to-drain electrode bonding region, and a step of depositing a film of a second drain electrode on the first drain electrode, so that a SiC semiconductor device having a high mechanical strength with a reduced energization loss is achieved.

20 Claims, 12 Drawing Sheets

(51) Int. Cl.
*H01L 21/304* (2006.01)
*H01L 29/16* (2006.01)
*H01L 29/78* (2006.01)

(56) References Cited

U.S. PATENT DOCUMENTS

| | | |
|---|---|---|
| 2013/0032822 A1 | 2/2013 | Ishibashi |
| 2014/0004696 A1 | 1/2014 | Kitabayashi |
| 2015/0008453 A1 | 1/2015 | Ishibashi |
| 2015/0008454 A1 | 1/2015 | Ishibashi |
| 2015/0214053 A1 | 7/2015 | Nakazawa et al. |
| 2015/0325637 A1 | 11/2015 | Ishibashi |
| 2016/0155640 A1 | 6/2016 | Nakajima et al. |
| 2018/0019307 A1* | 1/2018 | Fukada ............... H01L 29/1608 |
| 2018/0151364 A1* | 5/2018 | Yoshida ................ H01L 21/043 |
| 2019/0157397 A1* | 5/2019 | Odekirk .............. H01L 29/1608 |
| 2019/0362972 A1* | 11/2019 | Schulze ............ H01L 21/02378 |

FOREIGN PATENT DOCUMENTS

| | | |
|---|---|---|
| JP | 2009290062 A | 12/2009 |
| JP | 2010186991 A | 8/2010 |
| JP | 2010234507 A | 10/2010 |
| JP | 2011100948 A | 5/2011 |
| JP | 2013239554 A | 11/2013 |
| JP | 2014011224 A | 1/2014 |
| JP | 2014229843 A | 12/2014 |
| JP | 2015035461 A | 2/2015 |
| JP | 2017028219 A | 2/2017 |
| WO | 2013021902 A1 | 2/2013 |
| WO | 2014065018 A1 | 5/2014 |

OTHER PUBLICATIONS

Japanese Office Action dated Feb. 18, 2020 issued in Japanese Patent Application No. 2018-544747.

* cited by examiner

METHOD FOR MANUFACTURING SEMICONDUCTOR DEVICE

TECHNICAL FIELD

The present application relates to a method for manufacturing a semiconductor device and, in particular, relates to a method for manufacturing a front-to-back conductive semiconductor device.

BACKGROUND ART

Semiconductor devices that use silicon carbide (SiC) semiconductor substrates in order to allow the semiconductor devices to be made, for example, higher in breakdown voltage, lower in loss and usable in a high temperature environment, and that are superior in withstand voltage and heat resistance to silicon (Si) semiconductor devices, are applied to power semiconductor devices such as a MOSFET (metal-oxide-semiconductor field-effect transistor), a schottky barrier diode and the like. For example, in the case of a SiC semiconductor MOSFET with a breakdown voltage class of 1 to 1.2 kV, there is provided an ON-resistance of 5 mΩ cm$^2$ or less, the resistance value of which is half or less when compared with a Si semiconductor MOSFET or IGBT (Insulated Gate Bipolar Transistor) with the same breakdown voltage. The reason why the use of a SiC semiconductor can largely reduce the ON resistance in comparison with a Si semiconductor, is that the SiC semiconductor has a high dielectric-breakdown electric field and allows a voltage-withstanding layer (drift layer) for achieving the same breakdown voltage to be thinner than that of the Si semiconductor, and further allows the doping amount of impurities for the voltage withstand layer to be higher, and something like that. It is thought that, hereafter, replacement of most of Si semiconductor IGBTs by these devices as inverter components will be facilitated with achievement of: improvement in terms of their manufacturing cost; enhancement in their process technology; and other enhancement in their capabilities.

Heretofore, as a method of establishing bonding between a semiconductor substrate and an electrode at the time of manufacturing a front-to-back conductive semiconductor device, such a method is proposed that comprises a step of forming a semiconductor element structure on the major surface side of a silicon semiconductor substrate and thereafter, in the last process, grinding the back-surface side of the silicon semiconductor substrate and ion-implanting therein impurities whose conductivity type is the same as that of the back surface, and then forming thereon a metal thin film to be provided as an electrode (see, for example, Patent Document 1).

Meanwhile, as a method of establishing assured bonding while reducing power loss at the time of forming an electrode onto a silicon nitride (SiC) semiconductor substrate, such a method is proposed in which, with respect to a semiconductor element provided with the SiC substrate, a heat treatment is locally applied by optical heating to the electrode on the back surface of the substrate and at that treatment, its procedure and the conditions for the heat treatment are optimized, so that the semiconductor element can be manufactured in a good yield (see, for example, Patent Document 2).

CITATION LIST

Patent Document

Patent Document 1: Japanese Patent Application Laid-open No. H09-008062 (Paragraph 0007, FIG. 1)

Patent Document 2: Japanese Patent Application Laid-open No. 2010-186991 (Paragraph 0071, FIG. 1)

SUMMARY OF THE INVENTION

Problems to be Solved by the Invention

With respect to a front-to-back conductive semiconductor device, in order to reduce the energization loss of the semiconductor device, it is effective to cause thinning of its semiconductor substrate that acts as an electrically resistive component at the time of energization. However, because the contact area between the semiconductor substrate and the electrode changes depending on the degree of ground-surface unevenness that occurs when the thinning of the semiconductor substrate is performed, there is a problem that the electrical resistance between the semiconductor substrate and the electrode varies. Further, there is a problem that the chip strength is reduced due to crystal defects inside the semiconductor substrate that occur during grinding processing at the time of performing the thinning.

In Patent Document 1, there is described that, in the last process for manufacturing the semiconductor device, grinding processing is executed and thereafter, the metal thin film is formed after the implantation of the impurities; however, in order to establish electrical connection between the semiconductor substrate and the metal thin film, it is required to form their bonding plane at the interface between the semiconductor substrate and the metal thin film by applying thermal or optical energy or the like thereto. According to the structure of Patent Document 1, there is a problem that it is unclear whether adequate bonding has been established between the semiconductor substrate and the metal thin film.

According to Patent Document 2, the bonding between the semiconductor substrate and the electrode is achieved in such a manner that the electrode is formed after the thinning of the semiconductor substrate and then the heat treatment is applied from the back-surface side by using a high-power optical heating method.

However, because the electrical resistance between the semiconductor substrate and the metal thin film increases due to inclusion of a foreign material at the time of grinding the semiconductor substrate by machining, and the chip strength decreases due to crystal defects that occur during grinding of the semiconductor substrate, there is a problem that the chip is broken when it is mounted on a module board or when a load is applied thereto through energization.

This application has been made to solve the problems as described above, and an object thereof is to provide, with respect to a front-to-back conductive semiconductor device, a method for manufacturing a high quality semiconductor device, that can stably accomplish excellent bonding and low-resistance conduction between the semiconductor substrate and the electrode even though thinning of the semiconductor substrate has been performed in order to reduce the energization loss, and that can suppress the mechanical strength of the semiconductor device from decreasing due to grinding for the thinning.

Means for Solving the Problems

A method for manufacturing a semiconductor device according to the application is characterized by comprising: a first grinding step of grinding, using an abrasive, a back-surface side of a SiC substrate having an active region formed on a front-surface side thereof; a second grinding step of grinding a back-surface side of the SiC substrate providing after the first grinding step, using an abrasive having an average abrasive grain size of not less than 1 μm and not more than 5 μm; a step of depositing a film of a first main electrode on an electrode bonding region formed by the second grinding step; a step of electrically connecting the first main electrode with the electrode bonding region by using laser irradiation; and a step of depositing a film of a second main electrode on the first main-electrode subjected to the laser irradiation, wherein a grinding amount of the SiC substrate for grinding the back-surface side by the first grinding step and the second grinding step is 250 μm or more; and wherein a thickness of the SiC substrate becomes not less than 50 μm and not more than 150 μm.

Effect of the Invention

According to the application, the substrate is ground by using the grinding abrasive having a controlled abrasive grain size, so that it is possible not only to establish excellent bonding but also to achieve a semiconductor device having a high mechanical strength with a reduced energization loss.

MODES FOR CARRYING OUT THE INVENTION

Embodiment 1

Figure 1:
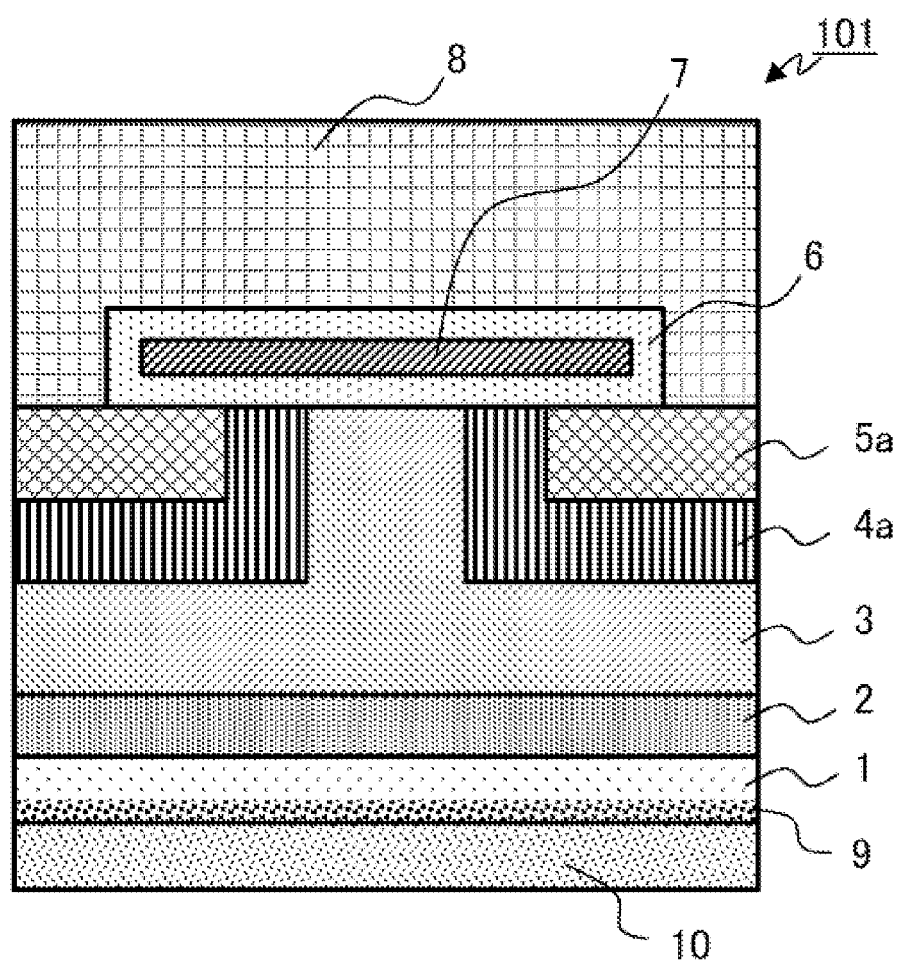
FIG. 1 is a sectional view for illustrating a configuration of a main part of a semiconductor device manufactured by the semiconductor device manufacturing method according to Embodiment 1 of the application.

FIG. 1 is a sectional view showing a cell structure of a main part of a semiconductor device manufactured by the semiconductor device manufacturing method according to Embodiment 1 of the application. A cell structure 101 is provided as a planer gate structure of a SiC-MOSFET that is a SiC semiconductor device. As shown in FIG. 1, in the cell structure 101, a first drift layer 2 made of n-type SiC is formed as a first-layered epitaxial film on a first major surface (hereinafter, referred to as a front surface) that is placed on the upper side of an n-type SiC substrate 1, and a second drift layer 3 is formed as a second-layered epitaxial film on the surface of the first drift layer 2. On the surface of the second drift layer 3, a pair of activated p-type base regions 4a is formed and further, an activated n-type source region 5a is formed partly on each of the surfaces of the pair of activated p-type base regions 4a. In addition, a gate electrode 7 is formed so that it is covered with a gate insulating film 6 and so that the pair of base regions 4a and the pair of source regions 5a are placed below the both end portions of said electrode 7 and a part of the second drift layer 3 located between the pair of base regions 4a is placed just beneath the center of the gate electrode 7. In this manner, on the front surface of the SiC substrate 1, an active region is formed that comprises the first drift layer 2, the second drift layer 3, the base regions 4a, the source regions 5a, the gate insulating film 6 and the gate electrode 7. Moreover, a source electrode 8 is formed so as to cover the pair of source regions 5a and to further cover the gate electrode 7 covered with the gate insulating film 6. Meanwhile, on a second major surface (hereinafter, referred to as a back surface) that is placed on the lower side of the SiC substrate 1, a drain electrode 10 as a first main electrode is formed on a SiC substrate-to-drain electrode bonding region 9 that is formed on the back-surface side of the SiC substrate 1 having been ground away to the extent corresponding to a specified thickness thereof. Note that, actually, the whole configuration of the SiC semiconductor device is such a configuration in which cell configurations each shown in FIG. 1 are successively placed across their both ends each as a line-symmetrical axis.

Figure 2:
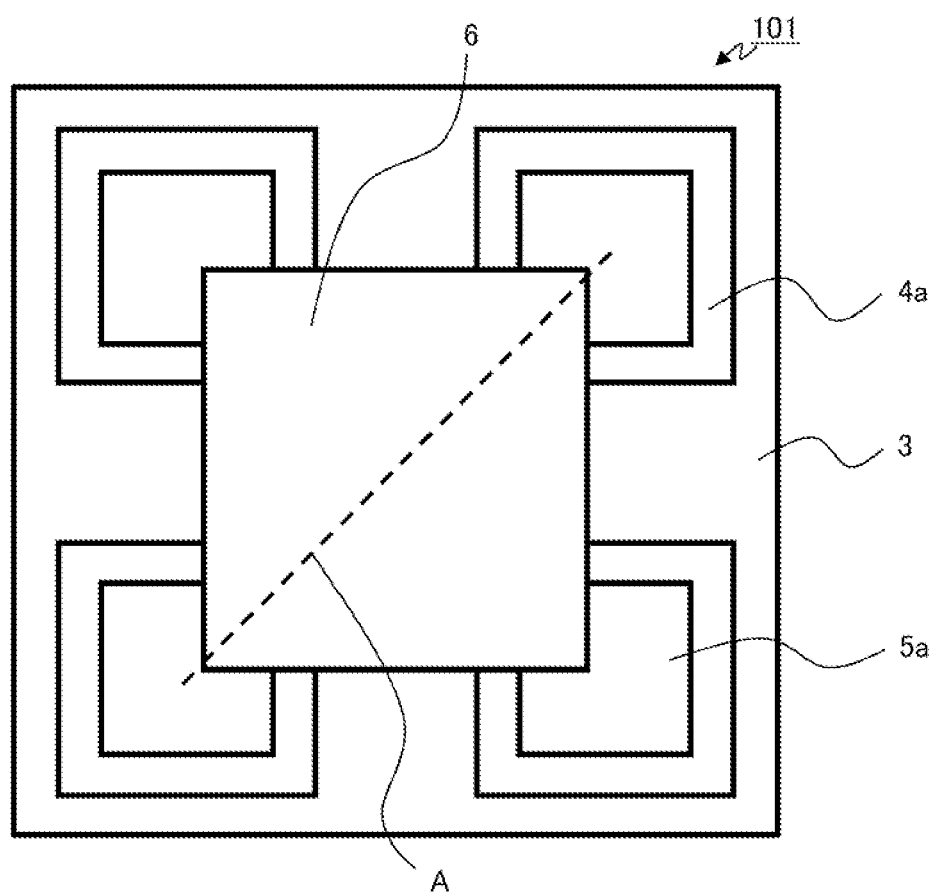
FIG. 2 is a top view for illustrating a configuration of a main part of the semiconductor device manufactured by the semiconductor device manufacturing method according to Embodiment 1 of the application.

FIG. 2 is a top view corresponding to FIG. 1. As shown in FIG. 2, the p-type base regions 4a and the n-type source regions 5a are formed in the second drift layer 3. The gate insulating film 6 shown in FIG. 2 that encloses the gate electrode 7 is placed in a grid-like manner on the upper side of the second drift layer 3. Although the source electrode 8 is further placed on the second drift layer 3 and the gate insulating film 6, it is omitted from illustration in FIG. 2. The cross section along a broken line portion A shown in FIG. 2 is what is shown in FIG. 1. Note that, where appropriate, the cell configuration may be modified according to a desired characteristic.

Figure 3:
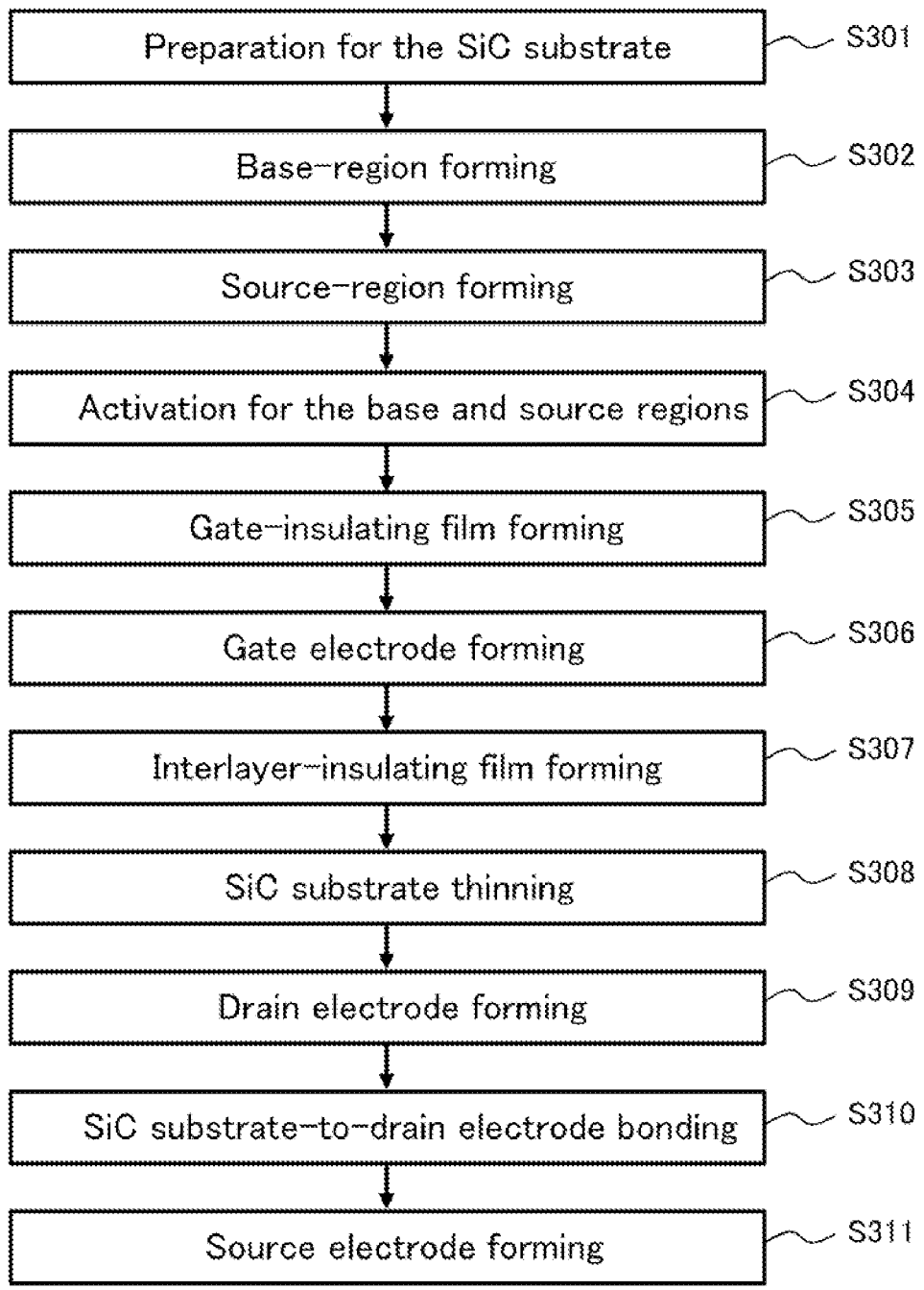
FIG. 3 is a flowchart showing manufacturing steps in the semiconductor device manufacturing method according to Embodiment 1 of the application.

In the following, the semiconductor device manufacturing method according to Embodiment 1 of the application will be described based on FIG. 3. FIG. 3 is a flowchart showing manufacturing steps in the semiconductor device manufacturing method according to Embodiment 1 of the application, and a SiC semiconductor device is manufactured according to this flow. FIG. 4A through FIG. 4J are sectional views of a cell at respective steps of manufacturing the semiconductor device according to Embodiment 1.

Figure 4A:
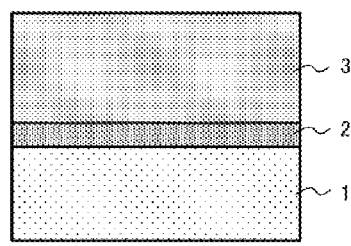
FIG. 4A through FIG. 4J are sectional views of a main part of a semiconductor device at respective manufacturing steps by the semiconductor device manufacturing method according to Embodiment 1 of the application.

First of all, in preparatory processing for the SiC substrate (Step S301), as shown in FIG. 4A, the first drift layer 2 made of n-type SiC is formed as a first-layered epitaxial film on the front surface of the n-type SiC substrate 1 and thereafter, the second drift layer 3 is formed as a second-layered epitaxial film in a contacting manner with the upper surface of the first drift layer 2 by using an epitaxial crystal growth method at a growth temperature that is lower than the growth temperature of the first drift layer 2.

Figure 4B:
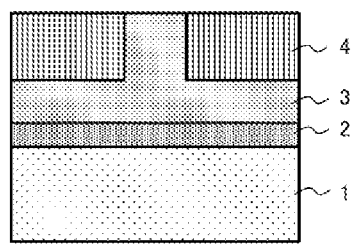

Subsequently, in base-region forming processing (Step S302), after the above-described epitaxial crystal growth was performed, impurities are ion-implanted into portions in a top layer of the second drift layer 3 that are apart from each other with a specified interval therebetween, after the formation of a mask pattern made of a resist or the like, to thereby form the pair of p-type base regions 4. FIG. 4B shows a vertical section structure of the element after the removal of the mask pattern made of a resist or the like. Examples of the impurity whose conductivity type is developed as p-type in the second drift layer 3 include, for example, boron (B) and aluminum (Al).

Figure 4C:
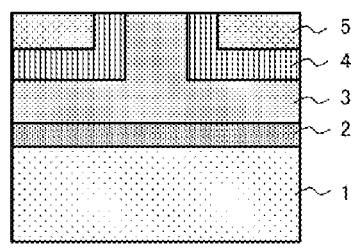

Then, in source-region forming processing (Step S303), impurities are ion-implanted into the respective p-type base regions 4 after the formation of a mask pattern made of a resist or the like, to thereby form the n-type source regions 5. FIG. 4C shows a vertical section structure of the element after the removal of the mask pattern. Examples of the n-type impurity include, for example, phosphorous (P), nitrogen (N) and arsenic (As).

Figure 4D:
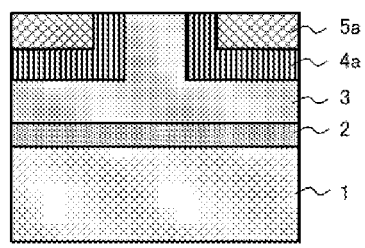

Subsequently, in activation processing for the base and source regions (Step S304), after the above described ion-implantation was executed, the SiC wafer is heat treated at a high temperature using a heat treatment apparatus, so that the p-type and n-type ions implanted in the base regions 4 and the source regions 5 are electrically activated, to thereby provide the activated base regions 4a and source regions 5a. FIG. 4D shows a vertical section structure of the element after that heat treatment.

Figure 4E:
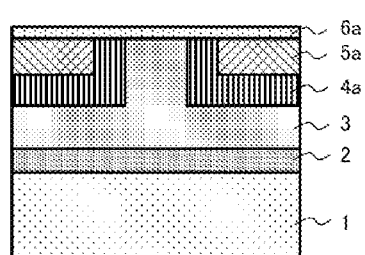
Figure 4F:
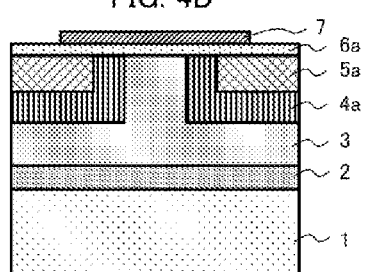
Figure 4G:
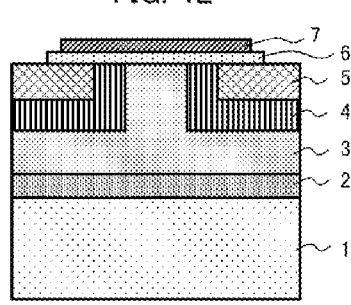

Then, in gate-insulating film forming processing (Step S305), as shown in FIG. 4E, a gate insulating film 6a is formed on the second drift layer 3 having the activated base regions 4a and source regions 5a, by using a thermal oxidation method or a deposition method such as a chemical vapor deposition or the like. Subsequently, in gate electrode forming processing (Step S306), a film of the gate electrode 7 is deposited on the insulating film 6a and then patterning of the gate electrode 7 is performed as shown in FIG. 4F. The gate electrode 7 is patterned so that the pair of base regions 4a and the pair of source regions 5a are placed below the both end portions of said electrode 7 and a part of the second drift layer 3 located between the pair of base regions 4a is placed just beneath the center of said electrode 7. Furthermore, as shown in FIG. 4G, a residual portion of the insulating film 6a on each of the source regions 5a is removed using a photolithographic technique and an etching technique.

Figure 4H:
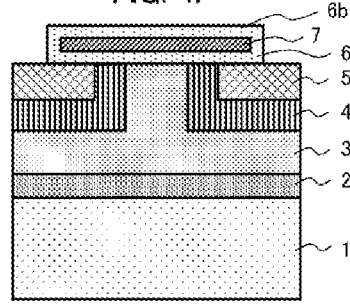

Thereafter, in interlayer-insulating film forming processing (Step S307), as shown in FIG. 4H, a deposition of an interlayer insulating film 6b and its patterning are performed.

Figure 4I:
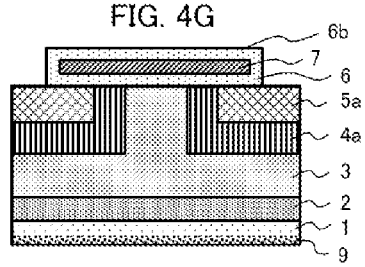

Then, in SiC substrate thinning processing (Step S308), as shown in FIG. 4I, thinning of the substrate is performed from the back-surface side in such a manner that machining is applied using a grinding abrasive made up of aluminum abrasive grains or diamond abrasive grains, to the back surface of the SiC substrate 1, thereby to make the SiC substrate 1 thin and further to form, on the back-surface side of the substrate, the SiC substrate-to-drain electrode bonding region 9 in which unevenness or crystal strain due to grinding is introduced for establishing bonding with a back-surface side electrode. By that thinning, when the thickness of the SiC substrate is 150 μm or less, the influence of the transverse rupture strength will appear remarkably and thus the effect of the application is more remarkable than otherwise.

Figure 5:
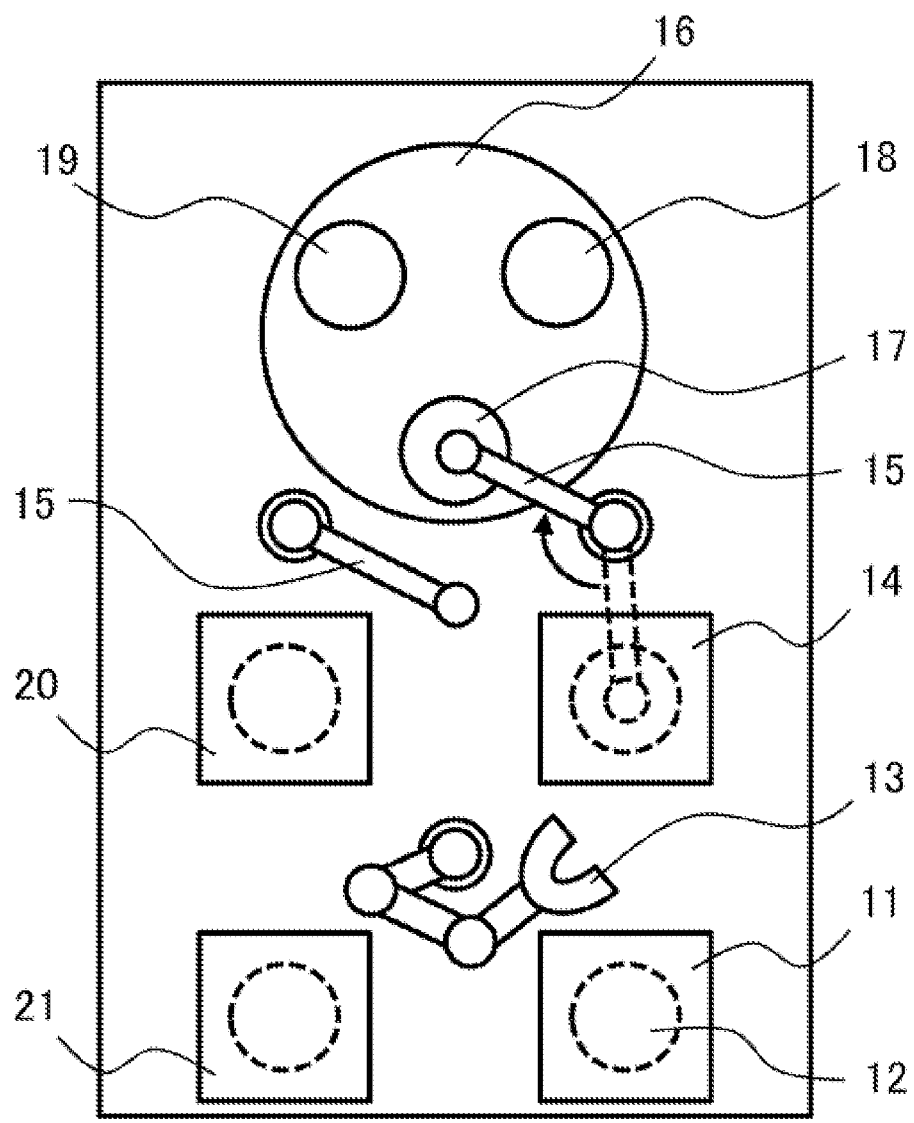
FIG. 5 is atop view of a manufacturing apparatus used in the semiconductor device manufacturing method according to Embodiment 1 of the application.

FIG. 5 is a top view of a back grinding apparatus of an infeed grinding system for thinning the SiC substrate 1. As shown in FIG. 5, a wafer 12 set in a wafer cassette 11 is transported by a transport robot 13 to an alignment mechanism 14. Thereafter, it is moved using a transport arm 15 to a wafer delivery section 17. Thereafter, it is moved to the position of a first grinding stage 18 in such a manner that a grinding processing stage 16 is rotated counterclockwise. It is moved, after completion of wafer grinding up to a preset thickness at the first grinding stage, to the position of a second grinding stage 19 in such a manner that the grinding processing stage 16 is further rotated counterclockwise.

At the second grinding stage, in a manner similar to that at the first grinding stage, processing of grinding a specified amount is performed.

Figure 6A:
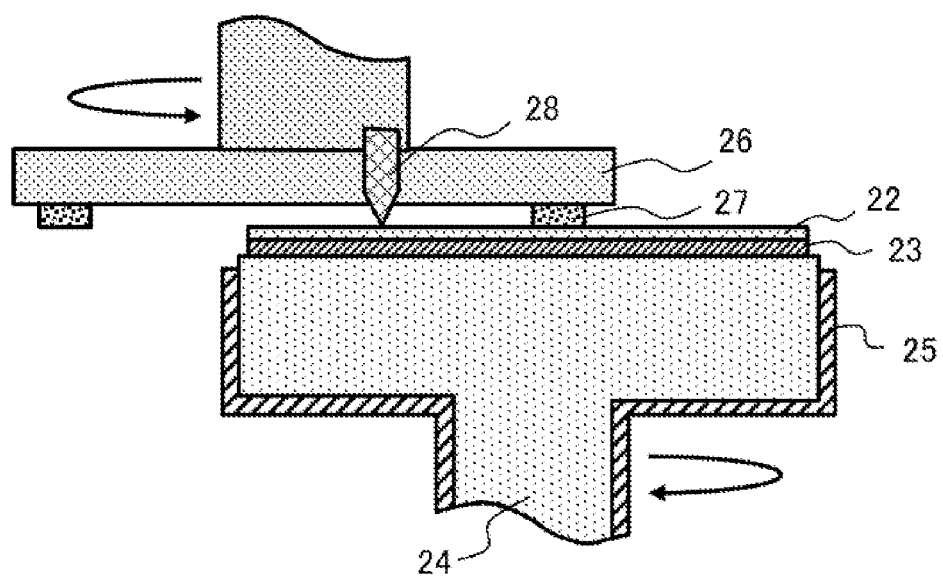
FIG. 6A and FIG. 6B are an enlarged sectional view and a top view of a main part of the manufacturing apparatus used in the semiconductor device manufacturing method according to Embodiment 1 of the application.
Figure 6B:
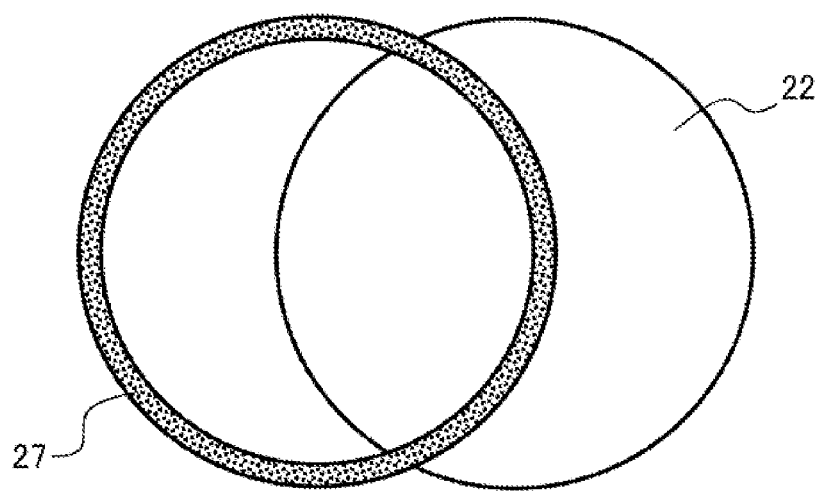

It is noted that, as a method of grinding processing on the back-surface side, infeed grinding may be applied in which, as represented by a sectional perspective view in FIG. 6A, after a surface protective member 23 made of a polyester protective member and an acrylic adhesive paste was affixed to the front-surface side of the wafer 22, said front-surface side is sucked to a suction stage 24 and thereafter, a grinding wheel 26 on which a segmental grinding abrasive 27 is fixed is moved closer onto the wafer at a constant speed while the suction stage 24 is being rotated in a fixed direction and while the grinding wheel 26 is being rotated in a fixed direction. FIG. 6B is a diagram showing a positional relationship between the wafer and the grinding abrasive in FIG. 6A, viewed from the upper side thereof. Instead, creep feed grinding may be carefully applied in which a workpiece is moved in a fixed direction against an abrasive that is rotating. On the grinding wheel 26, a contact-type thickness meter 28 is provided.

Figure 4J:
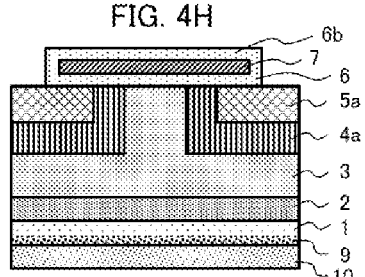

Then, in order to get bonding with the SiC substrate through the SiC substrate-to-drain electrode bonding region 9, in drain electrode forming processing (Step S309), the drain electrode 10 is formed on the back-surface side by using nickel, vanadium, aluminum, an aluminum alloy made of aluminum and silicon, or the like. Subsequently, in SiC substrate-to-drain electrode bonding processing (Step S310), as shown in FIG. 4J, electrical bonding between the SiC substrate and the drain electrode is carried out in such a manner that the wafer is heated using an anneal furnace that uses heater-based heating or the like or an anneal furnace that uses lamp-based heating or the like.

Lastly, in source electrode forming processing (Step S311), after the front-surface side of the SiC semiconductor device was cleaned beforehand using, on the front-surface side of the wafer, an aqueous solution containing hydrofluoric acid or an aqueous solution containing ammonia and hydrogen peroxide water, a metal barrier made of titanium or a titanium compound such as titanium nitride (TiN) or the like is formed on the source regions 5a and the interlayer insulating film 6b, and thereafter, a film of the source electrode 8 made of aluminum, an aluminum alloy of aluminum and silicon, nickel or the like is deposited and subjected to patterning, so that the cell structure 101 of the SiC semiconductor device shown in FIG. 1 is completed.

The material to be used for the source electrode 8 may be selected as appropriate according to a bonding method on the front-surface side, such as wiring, soldering or the like.

It is noted that, when nickel is used for the source electrode 8 and the drain electrode 10, the bonding state at the time the chip is bonded will be degraded because the wettability between the solder alloy and nickel becomes poor due to oxidation of its surface, so that, on the surface of nickel, a metal that is outwardly less reactive than that, such as gold, silver or the like, may be used as a protective film.

Figure 7A:
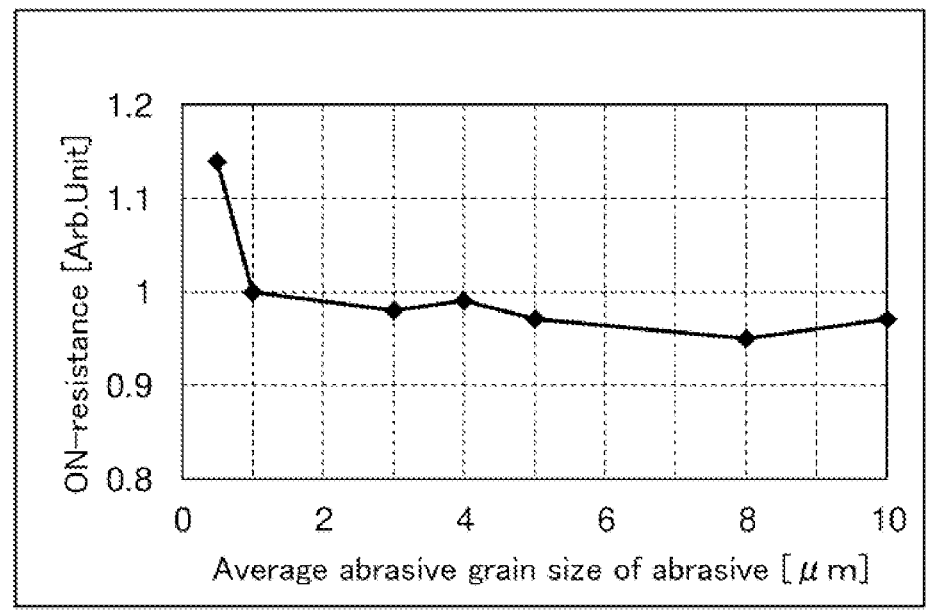
FIG. 7A and FIG. 7B are graphs showing relationships between an average abrasive grain size of an abrasive and an ON-resistance and between that size and a ball transverse rupture strength, with respect to the semiconductor device manufacturing method according to Embodiment 1 of the application.

In FIG. 7A, there is shown a relationship at the time the thinning processing is executed by the infeed grinding system as shown in FIG. 5, FIG. 6A and FIG. 6B that uses diamond abrasive grains, between an average abrasive grain size of the abrasive used in the last grinding, namely, at the second grinding stage 19, and a normalized ON-resistance of the cell structure 101 of the obtained SiC-MOSFET.

Figure 8A:
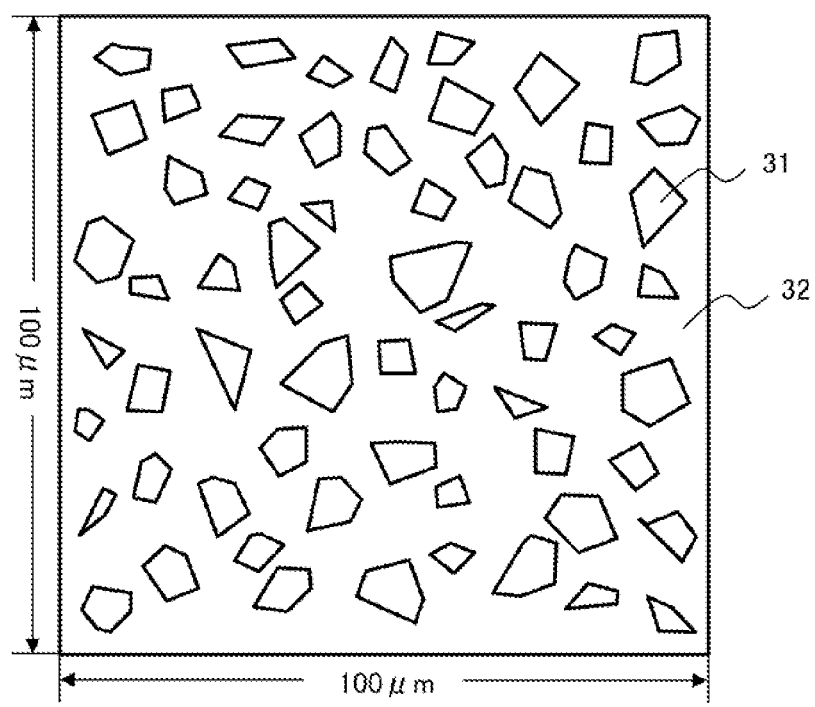
FIG. 8A and FIG. 8B are diagrams for illustrating how to measure the grain size of an abrasive, with respect to the semiconductor device manufacturing method according to Embodiment 1 of the application.
Figure 8B:
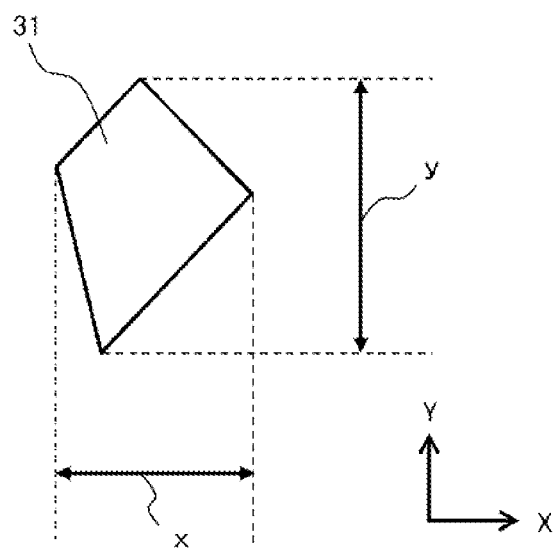

In a grain size measuring method, as shown in FIG. 8A, the surface of the abrasive is observed, for example, with a 100 μm/side field of vision using a Scanning Electron Microscope and, as shown in FIG. 8B, lengths in an X-direction and a Y-direction are measured for each abrasive grain confirmed in the field and then the average value thereof is calculated, so that the abrasive grain size can be calculated. Since the abrasive grains are directed randomly, all x and y values of measured lengths are averaged, so that the abrasive grain size is obtained. Further, the x value is a value resulted from length measurement of the width in the X-direction of each abrasive grain in the field and the y value is a value resulted from length measurement of the width in the Y-direction of each abrasive grain in the field. Here, the abrasive grain size means an average abrasive grain size in the abrasive with respect to diamond, a crystal made of alumina, boron and nitrogen, and the like, that may be contained in that abrasive. Note that the field may be changed as appropriate according to the sizes of the abrasive grains and the degree of concentration thereof.

As you can see by looking at that graph, when the average abrasive grain size of the abrasive used at the last grinding is set to 1 μm or more, it is possible to reduce the ON-resistance of the SiC-MOSFET at the time of energization because the SiC substrate and the drain electrode can be electrically bonded together due to increase in the unevenness of the surface, introduction of a fractured layer by mechanical grinding of the SiC substrate, and the like. Note that, at the time of measurement, such a value is determined as the ON-resistance of the semiconductor device, that is based on a voltage drop occurring when a voltage of 15 V is applied between the gate and the source and the semiconductor device is energized up to the rated current, and that is obtained when "a voltage drop value of the semiconductor device" is normalized by a voltage drop value thereof obtained when the average abrasive grain size of the abrasive is 1 μm.

Figure 7B:
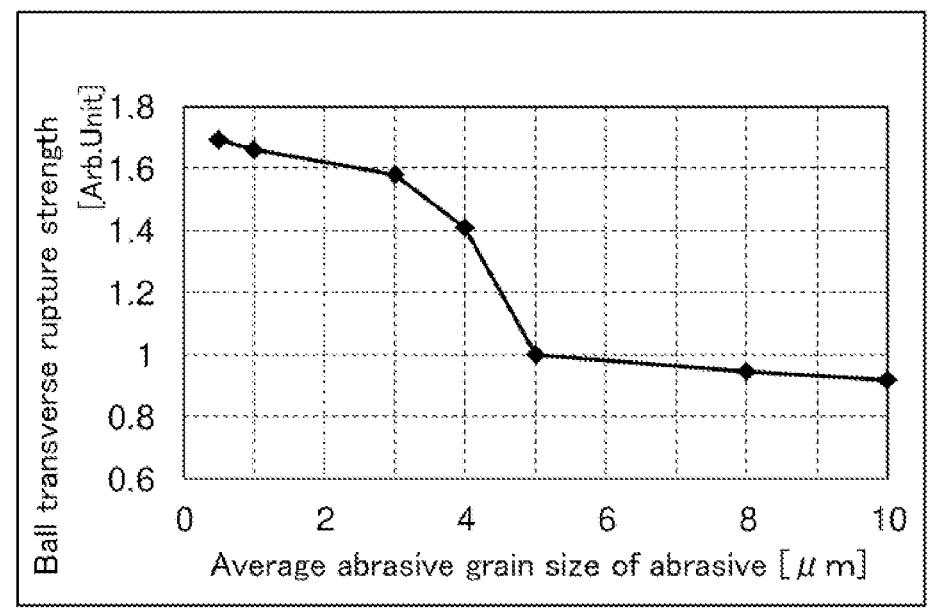

Further, in FIG. 7B, there is shown a relationship at the time the thinning processing shown in FIG. 5, FIG. 6A and FIG. 6B is executed, between an average abrasive grain size of the abrasive used at the last grinding and a ball transverse rupture strength of the cell structure 101 of the obtained SiC-MOSFET that is normalized according to the ball transverse test defined by JIS G 0202. As you can see by looking at that graph, when the average abrasive grain size of the abrasive used at the last grinding is set to 5 μm or less, it becomes possible to reduce the grinding damage due to grinding processing to thereby achieve sufficient transverse rupture strength for the SiC-MOSFET. Thus, when the multiple semiconductor devices formed on the wafer are segmentalized into the respective semiconductor devices, it is possible to reduce chipping or cracking of the segmentalized semiconductor device at its end portion occurring when an external force due to dicing is applied thereto; and when the semiconductor device (chip) is mounted in a semiconductor module, it is possible to reduce cracking of the semiconductor device (chip) caused by a stress applied to the chip due to a difference in linear expansion coefficient between a solder or like foreign material and SiC. This makes it possible to improve the yield significantly.

Accordingly, when the average abrasive gain size is set to not less than 1 μm and not more than 5 μm according to FIG. 7A and FIG. 7B, it is possible not only to establish excellent bonding but also to achieve a SiC semiconductor device having a high mechanical strength with a reduced energization loss.

As described above, the semiconductor device manufacturing method according to Embodiment 1 of the application comprises: a step of forming the first drift layer 2 made of n-type SiC on the front surface of the n-type SiC substrate 1; a step of forming the second drift layer 3 as a second-layered epitaxial film on the surface of the first drift layer 2; a step of forming the pair of p-type base regions 4 on the surface of the second drift layer 3, then forming the n-type source region 5 partly on each of surfaces of the p-type base regions 4, and thereafter forming the base regions 4a and source regions 5a that are electrically activated; a step of forming the gate electrode 7 that extends astride between the pair of base regions 4a and between the pair of source regions 5a, with the gate insulating film 6 sandwiched between that electrode and these regions; a step of grinding the back surface of the SiC substrate 1 and forming the SiC substrate-to-drain electrode bonding region 9, by using an abrasive whose average grain size is within the specified range; a step of forming the drain electrode 10 on the SiC substrate-to-drain electrode bonding region 9; a step of electrically connecting the drain electrode 10 to the SiC substrate-to-drain electrode bonding region 9; and a step of forming the source electrode 8 on the front-surface side after the drain electrode 10 was thus electrically connected. Thus, it becomes possible to establish excellent electrical bonding between the SiC substrate and the drain electrode and to reduce the grinding damage due to grinding processing, to thereby achieve a SiC semiconductor device having a high mechanical strength with a reduced energization loss.

Embodiment 2

In Embodiment 1, a step is shown in which the source electrode is formed after the formation of the drain electrode, whereas, in Embodiment 2, such a case will be described where the source electrode is formed before the formation of the drain electrode.

Figure 9:
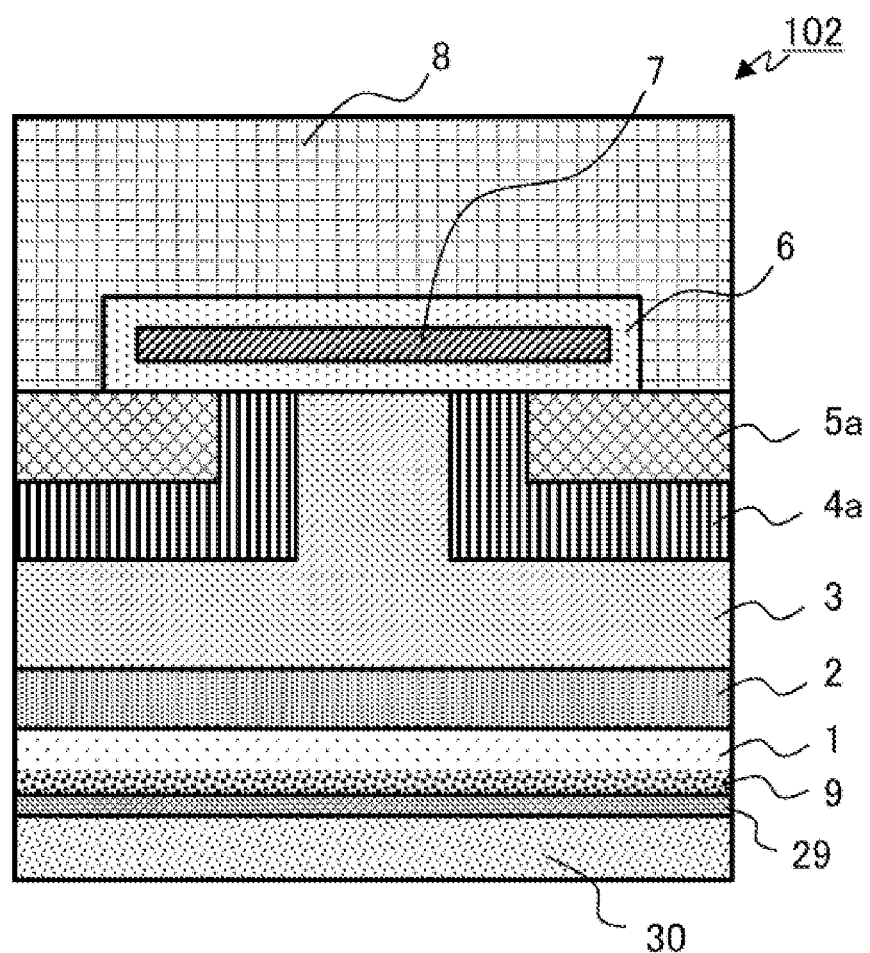
FIG. 9 is a sectional view for illustrating a configuration of a main part of a semiconductor device manufactured by the semiconductor device manufacturing method according to Embodiment 2 of the application.

FIG. 9 is a sectional view showing a cell structure of a main part of a semiconductor device manufactured by the semiconductor device manufacturing method according to Embodiment 2 of the application. As shown in FIG. 9, in a cell structure 102, on the back-surface side of the SiC substrate 1, a drain electrode (1) 29 for getting bonding with the SiC substrate through the drain electrode bonding region 9 is formed on the SiC substrate-to-drain electrode bonding region 9 that is formed on the back-surface side of the SiC substrate 1 having been ground away to the extent corresponding to a specified thickness thereof, and a drain electrode (2) 30 as a second main electrode is further formed on the surface of the drain electrode (1) 29 as a first main electrode. The other configuration is the same as that in the semiconductor device of Embodiment 1, so that its description is omitted here.

Figure 10:
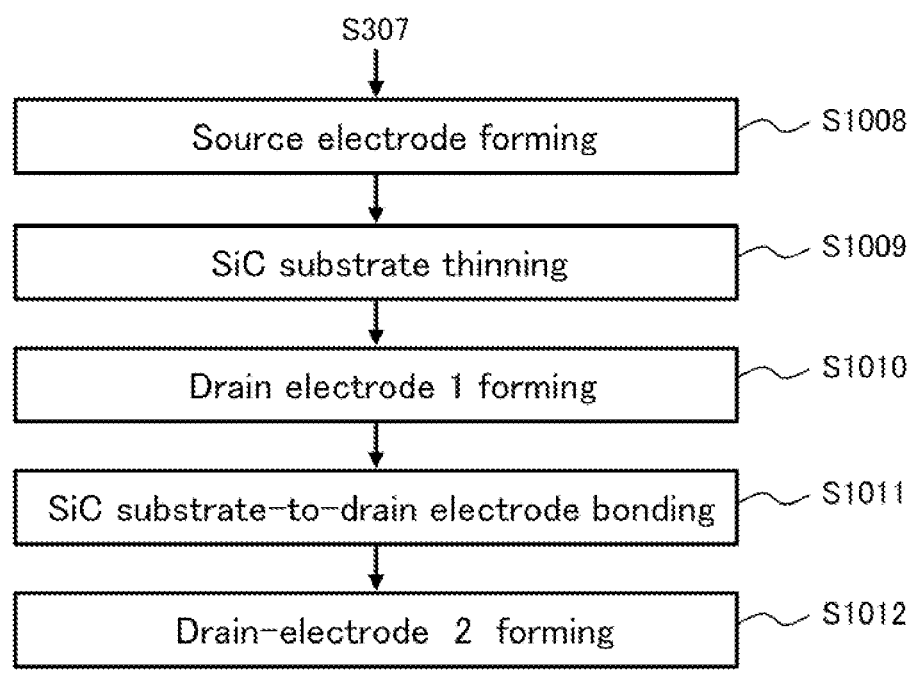
FIG. 10 is a flowchart showing manufacturing steps in the semiconductor device manufacturing method according to Embodiment 2 of the application.
Figure 11A:
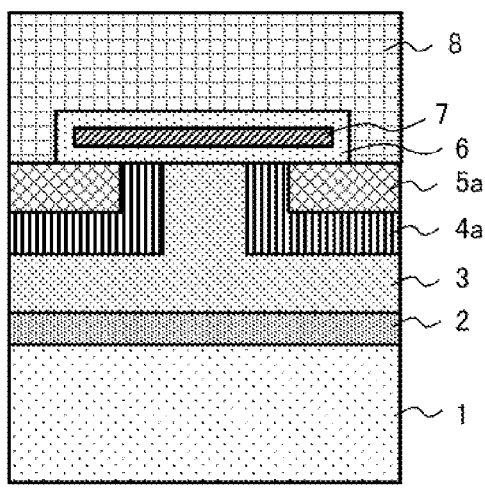
FIG. 11A, FIG. 11B and FIG. 11C are sectional views of a main part of a semiconductor device at respective manufacturing steps by the semiconductor device manufacturing method according to Embodiment 2 of the application.
Figure 11B:
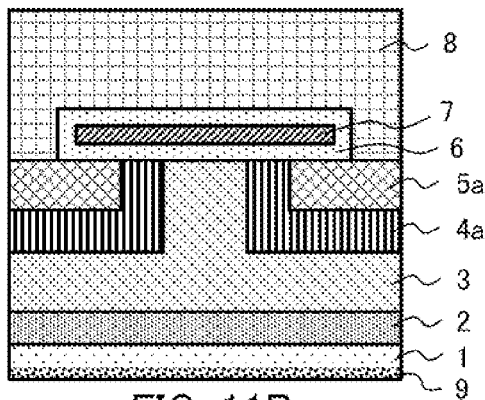
Figure 11C:
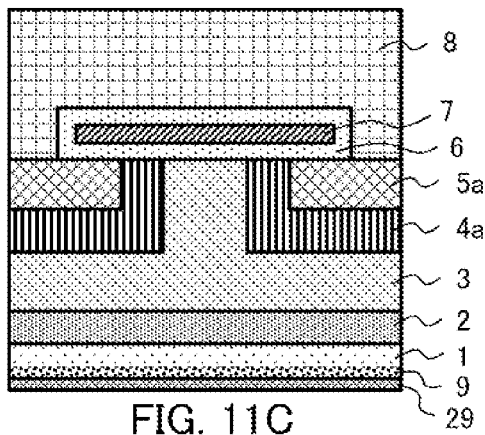

The semiconductor device manufacturing method according to Embodiment 2 of the application will be described based on FIG. 10. FIG. 10 is a flowchart showing manufacturing steps in the semiconductor device manufacturing method according to Embodiment 2 of the application. FIG. 11A, FIG. 11B and FIG. 11C are sectional views of a cell at respective semiconductor-device manufacturing steps according to Embodiment 2.

First of all, with respect to the preparatory processing for the SiC substrate through the interlayer insulating film forming processing, the same steps as Step S301 to Step S307 in Embodiment 1 are taken.

Then, in source electrode forming processing (Step S1008), after the front-surface side of the SiC semiconductor device was cleaned beforehand by using, on the front-surface side of the wafer, an aqueous solution containing hydrofluoric acid or an aqueous solution containing ammonia and hydrogen peroxide water, a metal barrier made of titanium or a titanium compound such as titanium nitride (TiN) or the like is formed on the source regions 5a and the interlayer insulating film 6b, and thereafter, a film of the source electrode 8 made of aluminum, an aluminum alloy of aluminum and silicon, nickel or the like is deposited and subjected to patterning, so that a cell structure on the front-surface side is completed as shown in FIG. 11A. Here, the material to be used for the source electrode 8 may be selected as appropriate according to a bonding method on the front-surface side, such as wiring, soldering or the like.

Subsequently, in SiC substrate thinning processing (Step S1009), as shown in FIG. 11B, thinning of the substrate is performed from the back-surface side in such a manner that machining is applied using a grinding abrasive made up of aluminum abrasive grains or diamond abrasive grains, to the back surface of the SiC substrate 1, thereby to make the SiC substrate 1 thin and further to form, on the back-surface side of the substrate, the region for getting bonding between the SiC substrate and the drain electrode, in which unevenness or crystal strain due to grinding is introduced for getting bonding with a back-surface side electrode.

For the thinning processing, infeed grinding may be applied in which, as shown in FIG. 5, FIG. 6A and FIG. 6B, the grinding wheel 26 is moved closer at a constant speed onto the wafer that is rotating on the grinding stage 18, 19. Instead, creep feed grinding may be carefully applied in which a workpiece is moved in a fixed direction against an abrasive that is rotating.

Then, in drain electrode (1) forming processing (Step S1010), after the execution of cleaning on the back-surface side of the wafer by using an aqueous solution containing hydrofluoric acid or an aqueous solution containing ammonia and hydrogen peroxide water, the drain electrode (1) 29 is formed. Specifically, a 10 to 200 nm nickel film is formed on the back-surface side by sputtering, evaporation or the like.

Subsequently, in SiC substrate-to-drain electrode bonding processing (Step S1011), as shown in FIG. 11C, electrical bonding between the SiC substrate and the drain electrode is carried out in such a manner that the back-surface side of the semiconductor substrate is heated by laser using a sold-state laser annealing system SWA-90GD from Sumitomo Heavy Industries, Ltd, Japan, or the like. Irradiation by laser makes it possible to heat it without affecting the source electrode 8 formed on the front surface.

With respect to the irradiation energy of laser, when the energy density is set to 0.5 to 3.0 J/cm$^2$, it is possible not only to establish excellent electrical bonding between the SiC substrate and the electrode but also to suppress occurrence of cracking in the SiC substrate.

Figure 12A:
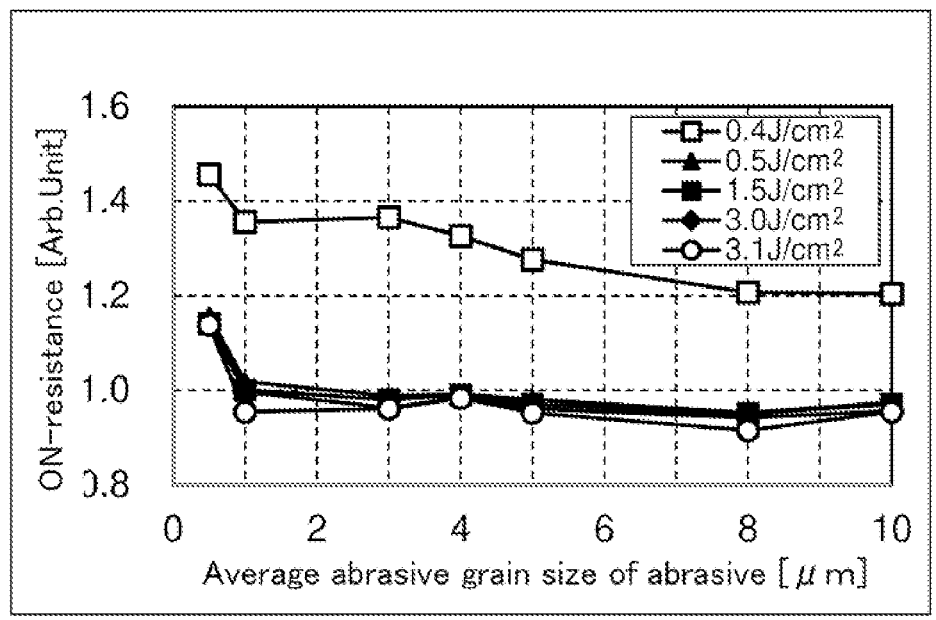
FIG. 12A and FIG. 12B are graphs showing relationships between an average abrasive grain size of an abrasive and an ON-resistance and between that size and a cracking ratio at the time of irradiation, with respect to the semiconductor device manufacturing method according to Embodiment 2 of the application.

As is shown by FIG. 12A, it is found that when the irradiation energy of laser is set to 0.5 J/cm$^2$ or more, a sufficient temperature of 500° C. or more is applied to the SiC substrate and the nickel film, so that SiC and nickel forms an alloy.

Figure 12B:
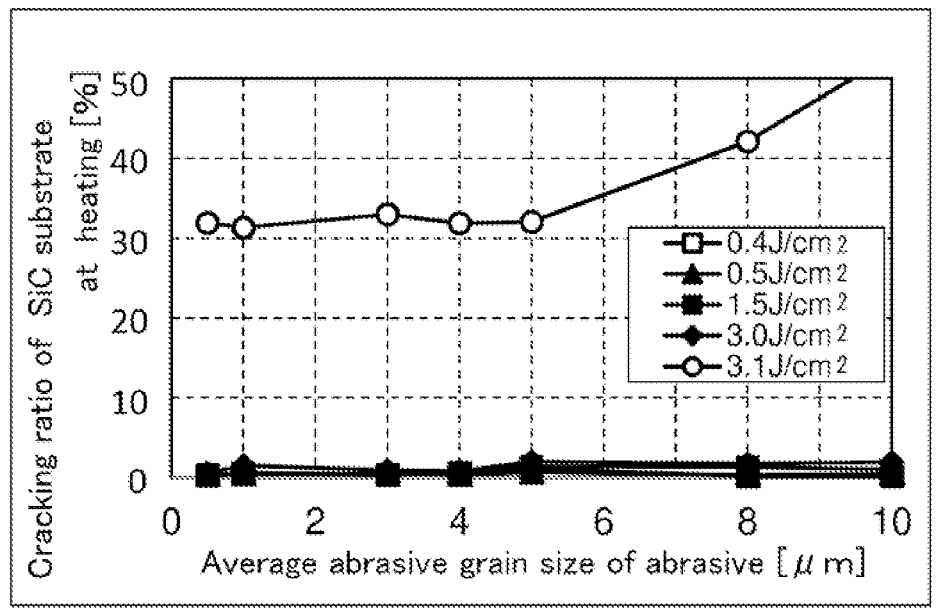

In FIG. 12B, a relationship between an average abrasive grain size of the abrasive at the thinning processing and a cracking ratio of the SiC substrate at the heating of that substrate by the laser irradiation, is shown for each of cases where the density of the irradiation energy of laser is varied. According to FIG. 12B, it is shown that, when the irradiation energy of laser becomes 3.1 J/cm$^2$ or more, the temperature gradient at a portion irradiated by laser becomes steep, so that cracking occurs in the SiC substrate. Thus, when it is set to less than 3.1 J/cm$^2$, namely, set to 3.0 J/cm$^2$ or less, it becomes possible to reduce the cracking ratio at the laser irradiation, so that the processing loss during manufacturing of the device can be reduced remarkably.

It is noted that, according to Embodiment 2, a relationship like that shown in FIG. 7B between the average abrasive grain size and the ball transverse rupture strength has also been obtained and thus, when the density of the irradiation energy of laser per one irradiation is set to 0.5 to 3.0 J/cm$^2$, it is possible by the laser irradiation to recover a defective layer due to mechanical grinding and introduced at the thinning processing, while promoting the alloying of SiC and nickel. With respect to the recovery effect, the higher the energy density becomes, the more the effect is created, and a density of the irradiation energy that is more than 1.5 J/cm$^2$ is preferable. Note that such a tendency that is similar to in the result in FIG. 12A and FIG. 12B are shown in cases where the thickness of the SiC substrate is not less than 50 μm and not more than 150 μm.

It is noted that, for bonding the SiC substrate with the nickel film as the drain electrode (1), it is preferable that the thickness of the nickel film be 10 nm or more in order to surely form an alloy of SiC and nickel, and it is desirable that it be 200 nm or less in order to suppress cracking of the wafer due to thermal shock at the laser irradiation for achieving alloying. Further, the wavelength of the laser annealing system may be carefully changed from within the range of 300 to 600 nm.

In the case where the grinding is performed using an abrasive having an average abrasive grain size of not less than 1 μm and not more than 5 μm, the nickel film is formed on the surface, and the density of the irradiation energy is set to not less than 1.5 and not more than 3.0 J/cm$^2$, it is more preferable that the thickness of nickel be not less than 20 nm and not more than 80 nm. If it is thinner than 20 nm, this may affect the electrical property, such as causing, for example, increase in conduction resistance between the SiC substrate and the nickel film, and if it is thicker than 80 nm, this may degrade the recovery effect of the defects by the irradiation energy of laser.

Further, in view of the transverse rupture strength, in the case where the grinding is performed using an abrasive having an average abrasive grain size of not less than 1 μm and not more than 5 μm, the nickel film is formed on the surface, and the density of the irradiation energy is set to not less than 1.5 and not more than 3.0 J/cm$^2$, the effect will be more remarkable when the grinding amount is 250 μm or more. When the grinding amount is large, it is expected that many defective layers are provided and thus the recovery effect is significant.

Lastly, in drain-electrode (2) forming processing (Step S1012), on the surface subjected to grinding processing on the back-surface side, the drain electrode (2) having a thickness of 10 to 50 times (for example, 600 nm) that of the laser-irradiated drain electrode (1), is formed using the same material of the drain electrode (1), for example, a nickel film is formed by sputtering, evaporation or the like, so that the cell structure 102 of the SiC semiconductor device shown in FIG. 9 is completed.

As described above, according to the relationship between the ON-resistance characteristic and the strength, the thickness of the drain electrode (1) is preferably not less than 10 nm and not more than 200 nm, and more preferably not less than 20 nm and not more than 80 nm. If this is the case, the drain electrode (1) functions as a contact to the SiC substrate; however, in consideration of a contact to the mounting board, the thickness of the drain electrode (2) is preferably 10 to 50 times that of the drain electrode (1). If it is less than 10 times, the drain electrode (2) may be diffused, at the time it is bonded with the mounting board, into a bonding material such as a solder, to thereby disappear. On the other hand, if it is more than 50 times, warpage due to the stress from the drain electrode (2) may occur in the SiC semiconductor device and thus a gap may emerge between the mounting board and the drain electrode (2), so that the conduction loss may increase due to reduction in their contact area.

When a nickel layer is formed in two steps in the above manner, it is possible to achieve bonding with the mounting board by using the drain electrode (2) while forming an assured contact to the SiC substrate through laser irradiation by using the drain electrode (1), and thus this case is preferable.

It is noted that, when nickel is used for the source electrode 8 and the drain electrode (2) 30, the bonding state at the time the chip is bonded will be degraded because the wettability between the solder alloy and nickel becomes poor due to oxidation of the surface, so that, on the surface of nickel, a metal that is outwardly less reactive than that, such as gold, silver or the like, may be used as a protective film.

In the above manner, the laser irradiation is used for SiC substrate-to-drain electrode bonding after the formation of the source electrode as shown in FIG. 10, so that, as compared with the case where the source electrode is formed after the thinning of the SiC substrate as shown in FIG. 3, it becomes unnecessary to perform in the thinned state, film deposition of the source electrode and its patterning by photolithography, plasma etching and/or wet etching. This makes it possible to reduce chipping or cracking of the wafer due to handling of the wafer during processing, so that the productivity can be improved.

Namely, at the time of thinning the SiC substrate by grinding; forming the nickel electrode and then executing the laser irradiation; after the formation of the nickel electrode, forming a metal such as gold, silver or the like as a protective film on that surface; and mounting the wafer on a dicing ring and segmentalizing it by dicing; it is possible to reduce the cracking ratio of the wafer after the laser irradiation and the cracking ratio of the chip at the dicing when the average abrasive grain size is not less than 1 μm and not more than 5 μm, and the energy density is not less than 1.5 and not more than 3.0 J/cm$^2$.

Further, in order to suppress nickel from being consumed due to solder bonding at the time of assembly, it is allowable for the source electrode and the drain electrode to perform depositing a thick nickel film exceeding 3 μm by nickel electroplating or nickel-phosphorous electroless plating. Further, in the drain electrode (1) forming processing (Step S1010) that is required for the bonding with the SiC substrate and in the drain electrode (2) forming processing (Step S1012) that is required for the bonding between the SiC semiconductor device and the mounting board for that device, it becomes possible to select a favorable film-deposition condition for each of them.

With respect also to the thus-obtained cell structure 102, a similar result to that in Embodiment 1 has been achieved regarding the ON-resistance that is reflective of the energization loss and the ball transverse rupture strength that is reflective of the mechanical strength. In Embodiment 2, for making the cell structure 102 thin, thinning processing has been executed also by the infeed grinding system using diamond abrasive grains. The relationship between the average abrasive grain size and the ON-resistance is similar to that in FIG. 7A and, when the average abrasive grain size of the abrasive used at the last grinding is set to 1 μm or more, a sufficient contact area between the SiC substrate and the drain electrode is ensured due to increase in the unevenness of the surface, so that the ON-resistance of the SiC-MOSFET at the time of energization could be reduced. On the other hand, the ball transverse rupture strength is also similar to that in FIG. 7B, and when the average abrasive grain size of the abrasive used at the last grinding is set to 5 μm or less, the unevenness of the surface decreases, so that a sufficient transverse rupture strength could be achieved for the SiC-MOSFET.

Accordingly, even in Embodiment 2, when the average abrasive gain size is set to not less than 1 μm and not more than 5 μm according to FIG. 7A and FIG. 7B, it is possible not only to establish excellent bonding but also to achieve a SiC semiconductor device having a high mechanical strength with a reduced loss by electrical bonding and by energization.

As described above, according to the semiconductor device manufacturing method according to Embodiment 2 of the application, after the formations of up to the source electrode 8 on the front-surface side of the SiC substrate 1, the back surface of the SiC substrate is ground and the SiC substrate-to-drain electrode bonding region 9 is formed, by using an abrasive whose average grain size is within a specified range, and after the drain electrode (1) 29 formed thinly on the SiC substrate-to-drain electrode bonding region 9 was electrically bonded thereto by the laser irradiation, the drain electrode (2) 30 is further formed on the laser-irradiated drain electrode (1) 29. Thus, it is possible not only to establish excellent bonding and to achieve a SiC semiconductor device having a high mechanical strength with a reduced energization loss, similarly to Embodiment 1, but also to form the source electrode before grinding of the SiC substrate. This reduces the number of steps in the thinned state, and thus a film quality of drain electrode that is favorable for each of the SiC substrate and the mounting board can be selected while reducing the wafer breakage rate during processing.

It is noted that, in Embodiment 2, the source electrode is formed before grinding of the SiC substrate; however, similarly to Embodiment 1, the source electrode 8 may be formed after the formation of the laser-irradiated drain electrode (1) 29 or after the formation of the drain electrode (2) 30. Even in this case, an effect similar to that in Embodiment 1 can be achieved.

Further, in the above embodiments, although a SiC substrate is used as the semiconductor substrate, this is not limitative. As its material, silicon (Si) or another material, such as gallium nitride (GaN), diamond or the like serving as a wide bandgap semiconductor material, is used.

It should be noted that unlimited combination of the respective embodiments and an appropriate modification/omission in the embodiments may be made in the present application without departing from the scope of the application.

DESCRIPTION OF REFERENCE NUMERALS AND SIGNS

1: SiC substrate, 2: first drift layer, 3: second drift layer, 4, 4a: base regions, 5, 5a: source regions, 6: gate insulating film, 6a: insulating film, 6b: interlayer insulating film, 7: gate electrode, 10 drain electrode, 29: drain electrode (1), 30: drain electrode (2).

The invention claimed is:

1. A method for manufacturing a semiconductor device, comprising:
   a first grinding step of grinding, using an abrasive, a back-surface side of a SiC substrate having an active region formed on a front-surface side thereof;
   a second grinding step of grinding a back-surface side of the SiC substrate provided after the first grinding step, using an abrasive having an average abrasive grain size of not less than 1 μm and not more than 5 μm;
   a step of depositing a film of a first main electrode on an electrode bonding region formed by the second grinding step;
   a step of electrically connecting the first main electrode with the electrode bonding region by using laser irradiation; and
   a step of depositing a film of a second main electrode on the first main electrode subjected to the laser irradiation,
   wherein a grinding amount of the SiC substrate for grinding the back-surface side by the first grinding step and the second grinding step is 250 μm or more; and
   wherein a thickness of the SiC substrate becomes not less than 50 μm and not more than 150 μm.

2. The method for manufacturing a semiconductor device of claim 1, wherein the second grinding step is a last grinding step.

3. The method for manufacturing a semiconductor device according to claim 2, wherein irradiation energy of a laser that is used at the time of electrically connecting the first main electrode with the electrode bonding region by using the laser irradiation, is not less than 0.5 J/cm² and not more than 3.0 J/cm².

4. The method for manufacturing a semiconductor device according to claim 3, wherein the first main electrode has a thickness of not less than 10 nm and not more than 200 nm.

5. The method for manufacturing a semiconductor device according to claim 4, wherein the second main electrode has a thickness that is not less than 10 times and not more than 50 times that of the first main electrode.

6. The method for manufacturing a semiconductor device according to claim 3, wherein the second main electrode has a thickness that is not less than 10 times and not more than 50 times that of the first main electrode.

7. The method for manufacturing a semiconductor device according to claim 3, wherein the first main electrode and the second main electrode are made of nickel.

8. The method for manufacturing a semiconductor device according to claim 2, wherein the first main electrode has a thickness of not less than 10 nm and not more than 200 nm.

9. The method for manufacturing a semiconductor device according to claim 8, wherein the second main electrode has a thickness that is not less than 10 times and not more than 50 times that of the first main electrode.

10. The method for manufacturing a semiconductor device according to claim 2, wherein the second main electrode has a thickness that is not less than 10 times and not more than 50 times that of the first main electrode.

11. The method for manufacturing a semiconductor device according to claim 2, wherein the first main electrode and the second main electrode are made of nickel.

12. The method for manufacturing a semiconductor device according to claim 1, wherein irradiation energy of a laser that is used at the time of electrically connecting the first main electrode with the electrode bonding region by using the laser irradiation, is not less than 0.5 J/cm² and not more than 3.0 J/cm².

13. The method for manufacturing a semiconductor device according to claim 12, wherein the first main electrode has a thickness of not less than 10 nm and not more than 200 nm.

14. The method for manufacturing a semiconductor device according to claim 13, wherein the second main electrode has a thickness that is not less than 10 times and not more than 50 times that of the first main electrode.

15. The method for manufacturing a semiconductor device according to claim 12, wherein the second main electrode has a thickness that is not less than 10 times and not more than 50 times that of the first main electrode.

16. The method for manufacturing a semiconductor device according to claim 12, wherein the first main electrode and the second main electrode are made of nickel.

17. The method for manufacturing a semiconductor device according to claim 1, wherein the first main electrode has a thickness of not less than 10 nm and not more than 200 nm.

18. The method for manufacturing a semiconductor device according to claim 17, wherein the second main electrode has a thickness that is not less than 10 times and not more than 50 times that of the first main electrode.

19. The method for manufacturing a semiconductor device according to claim 1, wherein the second main electrode has a thickness that is not less than 10 times and not more than 50 times that of the first main electrode.

20. The method for manufacturing a semiconductor device according to claim 1, wherein the first main electrode and the second main electrode are made of nickel.

* * * * *